United States Patent [19]

Baldi

[11] Patent Number: 4,970,114

[45] Date of Patent: Nov. 13, 1990

[54] COATING AND ACTIVATION OF METALS

[75] Inventor: Alfonso L. Baldi, Wynnewood, Pa.

[73] Assignee: Alloy Surfaces Company, Inc., Wilmington, Del.

[21] Appl. No.: 182,718

[22] Filed: Apr. 18, 1988

Related U.S. Application Data

[63] Continuation-in-part of Ser. No. 96,368, Sep. 11, 1987, Pat. No. 4,880,483, Ser. No. 28,741, Mar. 23, 1987, Ser. No. 862,712, May 13, 1986, Pat. No. 4,871,708, Ser. No. 830,767, Feb. 19, 1986, Pat. No. 4,799,979, Ser. No. 777,755, Sep. 19, 1985, abandoned, Ser. No. 757,606, Jul. 22, 1985, abandoned, Ser. No. 707,656, Mar. 4, 1985, Pat. No. 4,824,482, Ser. No. 685,910, Dec. 27, 1984, Pat. No. 4,820,362, Ser. No. 643,781, Jul. 17, 1984, Pat. No. 4,815,386, Ser. No. 584,558, Feb. 28, 1984, Pat. No. 4,845,139, Ser. No. 538,541, Oct. 3, 1983, Pat. No. 4,830,931, and Ser. No. 479,211, Mar. 28, 1983, Pat. No. 4,897,375, said Ser. No. 96,368, is a continuation-in-part of Ser. No. 559,334, Dec. 8, 1983, abandoned, Ser. No. 507,174, Jun. 23, 1983, Pat. No. 4,694,036, and Ser. No. 281,405, Jul. 8, 1981, Pat. No. 4,708,913, said Ser. No. 28,741, Ser. No. 862,712, Ser. No. 830,767, Ser. No. 777,755, Ser. No. 757,606, Ser. No. 707,656, Ser. No. 685,910, Ser. No. 643,781, Ser. No. 584,538, Ser. No. 538,541, and Ser. No. 479,211, each is a continuation-in-part of Ser. No. 559,334, , Ser. No. 507,174, , Ser. No. 281,405, , and Ser. No. 488,103, Apr. 25, 1983, Pat. No. 4,615,920.

[51] Int. Cl.$^5$ ............................................. C06B 45/30
[52] U.S. Cl. .................................... 428/326; 428/328; 428/337
[58] Field of Search ................... 428/242, 317.9, 328, 428/408, 461, 463, 553, 559, 326, 337; 102/364; 149/3

[56]  References Cited

U.S. PATENT DOCUMENTS

| 3,831,258 | 8/1974 | Elbert et al. | 428/553 |
| 4,349,612 | 9/1982 | Baldi | 428/457 X |
| 4,435,481 | 3/1984 | Baldi | 428/457 X |
| 4,471,358 | 9/1984 | Glasser | 102/505 X |
| 4,799,979 | 1/1989 | Baldi | 102/505 X |

Primary Examiner—Marion C. McCamish
Attorney, Agent, or Firm—Connolly & Hutz

[57]  ABSTRACT

Pyrophoric powder can be coated on boron or carbon fibers or sintered with combustible particles. Carbon can be kept from contaminating diffusion-treated workpieces, by conducting diffusion treatment in retorts containing little or no carbon. Porosity can be created by subjecting workpiece to diffusion conditions in contact with depleting material such as powdered nickel or high-nickel aluminides or cobalt or high-cobalt aluminides. Aluminum particles can be electrophoretically deposited on foil and then diffused in. Leaching aluminum out with caustic is improved when a little $H_2O_2$ is present in the caustic. Subsequent treatment of the leached surface with weak acid further improves pyrophoricity, and folding of the pyrophoric member extends its pyrophorically-generated high temperature dwell. Resin foil containing pyrophoric particles makes effective decoy.

6 Claims, No Drawings

COATING AND ACTIVATION OF METALS

This application is a continuation-in-part of application Ser. No. 07/096,368 filed Sept. 11, 1987, now U.S. Pat. No. 4,880,483 which in turn is a continuation-in-part of (a) application Ser. No. 06/559,334 filed Dec. 8, 1983 and subsequently abandoned, and (b) application Ser. No. 06/507,174 filed June 23, 1983, now U.S. Pat. No. 4,694,036, and (c) application Ser. No. 06/281,405 filed July 8, 1981, now U.S. Pat. No. 4,708,913.

The present application is also a continuation-in-part of application Ser. No. 07/028,741 filed Mar. 23, 1987, which in turn is also a continuation-in-part of the above-noted (a), (b) and (c) applications as well as a continuation-in-part of (d) application Ser. No. 488,103 filed Apr. 25, 1983, now U.S. Pat. No. 4,615,920.

The present application is also a continuation-in-part of application Ser. No. 06/757,606 filed July 22, 1985 and subsequently abandoned, but in turn a continuation-in-part of the above-noted (a), (b), (c) and (d) applications.

The present application is also a continuation-in-part of application Ser. No. 06/862,712 filed May 13, 1986, now U.S. Pat. No. 4,871,708 which in turn is a continuation-in-part of the above-noted (a), (b), (c) and (d) applications.

The present application is also a continuation-in-part of application Ser. No. 06/830,767 filed Feb. 19, 1986, now U.S. Pat. No. 4,799,979, which in turn is a continuation-in-part of the above-noted (a), (b), (c) and (d) applications.

The present application is also a continuation-in-part of application Ser. No. 777,755 filed Sept. 19, 1985, now abandoned which in turn is a continuation-in-part of the above-noted (a), (b), (c) and (d) applications.

The present application is also a continuation-in-part of application Ser. No. 06/707,656 filed Mar. 4, 1985, now U.S. Pat. No. 4,824,482, which in turn is a continuation-in-part of the above-noted (a), (b), (c) and (d) applications.

The present application is also a continuation-in-part of application Ser. No. 06/685,910 filed Dec. 27, 1984, now U.S. Pat. No. 4,820,362, which in turn is a continuation-in-part of the above-noted (a), (b), (c) and (d) applications.

The present application ia also a continuation-in-part of application Ser. No. 06/643,781 filed July 17, 1984, now U.S. Pat. No. 4,815,386, which in turn is a continuation-in-part of the above-noted (a), (b), (c) and (d) applications.

The present application is also a continuation-in-part of application Ser. No. 06/584,538 filed Feb. 28, 1984, now U.S. Pat. No. 4,845,139, which in turn is a continuation-in-part of the above-noted (a), (b), (c) and (d) applications.

The present application is also a continuation-in-part of application Ser. No. 06/538,541 filed Oct. 3, 1983, now U.S. Pat. No. 4,830,931, which in turn is a continuation-in-pat of the above-noted (a), (b), (c) and (d) applications.

The present application is also a continuation-in-part of application Ser. No. 06/479,211 filed Mar. 28, 1983, now U.S. Pat. No 4,897,375 which in turn is a continuation-in-part of the above-noted (a), (b), (c) and (d) applications.

The present invention relates to the treatment of metals to coat and activate them.

Among the objects of the present invention is the provision of novel metal treatment techniques.

Additional objects of the present invention are novel forms of treated metal.

The foregoing as well as still further objects of the present invention will be more fully understood from the following description of several of its exemplifications.

The usual diffusion coating of metals, as practiced by embedding the metal to be coated in a powder pack and heating in a controlled atmosphere at very high temperatures for many hours, is quite an expensive operation.

According to the present invention, a substantial cost saving can be effected by a modification that does not require the usual very high temperatures or times. In this modification there is first prepared an alloy of aluminum containing relatively small amounts of other metals to be coated onto a substrate. This pre-prepared alloy contains sufficient aluminum to bring its melting point down to 1800° F. or below, preferably 1400° F. or below It can then be readily flame-sprayed on a workpiece, or the workpiece can be dip-coated in the molten alloy, and if desired the resulting coated workpiece heated in a protective atmosphere to improve the bonding. A diffusion coating activator like $NH_4Cl$ or $NH_4HF_2$ can be used to help generate the protective atmosphere.

After the coating is completed, the coated workpiece is then dropped into a leaching bath that dissolves out most of the aluminum from the coating. Where some specific amount of aluminum is desired to be present in the coating after the leaching is completed, the leaching is terminated before the residual aluminum content drops too low.

After the completion of the leaching the workpiece has the desired coating, but the coating is in a microporous condition due to the voids introduced where the aluminum has been leached out. In such condition the coating is particularly receptive to receiving and anchoring top layers such as ceramic thermal barriers applied over jet engine vanes and blades.

Cobalt also provides a suitable porous undercoat when applied and then rendered porous. While iron is quite similar in its characteristics, the leaching of iron-aluminum undercoating should be quite limited inasmuch as heavy leaching leaves the porous iron residue poorly adherent to the substrate.

As described in the parent applications, the pyrophoric action of pyrophoric members can be increased by placing in intimate contact with the member, a solid or liquid that undergoes an exothermic reaction when heated. Metals like magnesium and titanium, and even boron, can thus be adhered to a pyrophoric foil as by placing a magnesium ribbon over an activated foil and passing the assembly between a pair of pressure rollers. Powdered materials such as magnesium, titanium, manganese, zirconium, carbon, aluminum or boron can be dispersed in a volatile liquid and the dispersion applied to an activated member and dried. Commercially available boron powder is very effective when dispersed in an alcohol such as ethanol.

Such pyrophoric combinations need not be in the form of very thin coated foils, and can take other forms. Thus a 5-mil thick felt of boron or carbon fibers or ordinary paper or cotton cloth can be coated on one or both sides with a paste of pyrophorically activated iron or nickel powder, and the coated felt subjected to a drying and if desired a sintering treatment to form a self-supporting sheet in which the pyrophoric particles are embedded in the inter-fiber spaces. A boron felt weighing about 0.1 gram per square centimeter of gross surface (as measured with a ruler), carrying 0.2 gram pyrophoric iron powder per square centimeter of gross surface, generates a very large amount of heat when exposed to the atmosphere. Ordinary steel wool also makes a very effective porous substrate for impregnation.

The activated iron powder is readily prepared by activating the surface of an iron foil or sheet and s:raping off the activated layer. Raney iron can also be used. Activated nickel powder can be prepared the same way but the scraping is much more difficult and it is accordingly preferred to use Raney nickel powder or to leach powdered $NiAl_3$ with alkali.

Instead of making a pyrophoric combination by starting with a sheet of felted fibers, the starting material can be a porous sheet or disc prepared as by a sintering operation so as to contain at least about 20% voids. The voids are then impregnated with pyrophoric or combustible particles as by merely applying to the sintered sheet or disc a slurry of the particles suspended in water or other volatile liquid. The presence of 1 to 5% resin binder in the liquid, based on the weight of the suspended particles, helps retain them in place after they are impregnated into the pores. Such particles are preferably about 1 mil or less in thickness, and the pores at least about 3 times the particle size. The porous sheet or disc can thus be sintered from particles at least about 10 mils in diameter so as to contain such large voids.

Alternatively the pyrophorically activated particles can be mixed with the non-pyrophoric combustible particles and the mixture thus sintered into the desired finished structure. In this modification powdered 100 mesh magnesium is for example mixed with one-half to twice its weight of minus 180 mesh pyrophoric iron or nickel powder, and the mixture first compacted under argon at 10,000 pounds per square inch into a disc about 5 mils thick, and then sintered at about 600° C. Only about 30 minutes at that temperature is sufficient. Higher temperatures can be used with other materials, but may cause excessive thermal deterioration of the pyrophoric particles and should be limited to shorter times.

Other particles such as of boron, zirconium and the like can be included in the mixture being sintered, even though these other particles do not significantly sinter together under the sintering conditions, so long as they are not in such large proportions as to prevent the sintering of the sinterable particles. For the greatest thermal output a high boron content is desired, at least 20% by weight, and some easily ignited metal such as magnesium, titanium or zirconium can be used to be more readily ignited by the pyrophoric particles. Because the non-pyrophoric particles act as heat sinks, the content of pyrophoric particles should be at least ⅓ by weight in order to reach the necessary ignition temperature, at least in one portion of the sintered member. Pyrophoric nickel particles are somewhat more effective than pyrophoric iron particles in igniting non-pyrophoric particles.

The compacted and/or sintered mixtures can be made using pyrophoricity-developing particles that are not leached until the compacting and/or sintering is completed, but the products produced this way are less effective.

The non-pyrophoric coating ignited by a pyrophoric substrate can be of the type that exothermally reacts in the absence of atmospheric oxygen. Thus the coating can be picric acid or a thermite mixture of finely divided aluminum and iron oxide powders, or ammonium dichromate, or gunpowder or a mixture of finely divided iron or boron with sodium nitrate or chlorate. Such a coating only about 1 or 2 mils thick on a pyrophorically activated iron or nickel foil about 2 mils thick, is ignited by the pyrophoric action when the coated foil is discharged into the thin air at altitudes of about 30,000 to 50,000 feet, and then generates supplemental heat more effectively than the pyrophoric action at those altitudes.

A little resin binder may be used to help hold such exothermic coatings in place, although soluble materials can be adherently deposited from solution in a vaporizable solvent such as methanol or water, and the solvent then vaporized off.

The foregoing exothermic coatings that react in the absence of atmospheric oxygen, can also be effectively applied to the above-discussed discs.

The sintered products can have their pyrophoricity blocked by the same coatings or atmospheres used to preserve pyrophoric foils. Moreover by combining two different types of coatings, enhanced blocking effects are obtainable. Thus dipping an activated iron or nickel foil in a 30% aqueous dispersion of colloidal silica, followed by removal and drying of the dipped foil, leaves a foil surface that more slowly generates pyrophoric heat. The heat dwell is made a few seconds longer and the peak temperature reached can be almost 100° F. lower. However when 10 to 90% of the silica in the dispersion is replaced by the triethanolamine chelate of diproproxy titanium, the pyrophoricity-blocking effect is much more pronounced. The heat dwell can then be extended about 40% while the peak temperature drops a little over 200° F. A mixture of about 2 parts silica and about 3 parts chelate, is preferred.

The foregoing chelate has the formula

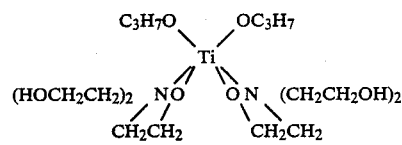

Triethanolamine, diethanolamine or monoethanolamine can be mixed with the colloidal silica to give effects similar to those of the chelate, and colloidal alumina can be correspondingly substituted for the colloidal silica, as can colloidally-sized, i.e. submicron-sized, particles of other inert solids.

The leaching after compacting and sintering to make pyrophoric masses, is particularly desirable for the making of masses such as discs or ribbons whose pyrophoric action is desired to have a long duration. This is illustrated in Example 1.

EXAMPLE 1

A mixture of carbonyl iron powder with an equal weight of fine aluminum powder is pressed together and sintered as described in U.S. Pat. No. 3,379,635 to form a disc about 50 mils thick. The disc is then leached with hot 30% NaOH solution overnight to yield a pyrophoric porous article which when exposed to air generates heat for about two minutes.

The maximum temperature developed at the disc's surface is only about 400° F., but this temperature can be increased by impregnating the porous disc with material that is rendered exothermic by the pyrophoricity Thus an aqueous suspension of micron-sized powdered zirconium can be poured on the porous disc to cause the fine zirconium particles to lodge within the disc's pores. On drying, the pyrophoric heat generation ignites the zirconium so that the maximum temperature of the disc's surface goes well above 400° F.

Powdered boron is a very effective heat generator but ignites at a temperature higher than zirconium does. Impregnating the foregoing porous disc with a mixture of 5 weight % zirconium and 5 weight % boron, based on the weight of the unimpregnated disc, yields a very effective pyrophoric combination however, in which both the zirconium and the boron burn upon exposing the impregnated disc to air.

A feature of the construction of Example 1 is that the pyrophoric product made, whether or not impregnated, is very inexpensive to prepare. The total cost of the ingredients is quite small, and the compacting and sintering steps are not expensive. No diffusion coating is needed and the sintering can be completed in as little as 30 minutes. An inert or reducing atmosphere is preferably used for the sintering.

Nickel powder can be substituted for the iron powder in the compacts, but is preferably mixed with $1\frac{1}{2}$ times its weight of aluminum powder. A 50-mil thick disc press-sintered from such a mixture and then leached 14 hours with hot 20% aqueous NaOH is more pyrophoric than the leached iron-aluminum disc of Example 1 but its pyrophoricity does not last as long Such a leached nickel-aluminum disc can have its pores impregnated with inert particles such as the alumina and silica mentioned supra, to stretch out its pyrophoric heat output On the other hand it can be impregnated with heat-generating materials to further accentuate its high heat output. It will for example ignite micron-sized boron particles without the need for the low-ignition-temperature zirconium.

The press-sintered masses can be made thicker or thinner than 50 mils. Making them 10 mils thick for example, makes them sufficiently light in weight so that they will fall through the air relatively slowly, particularly if the discs are $1\frac{1}{2}$ inches or more in diameter. A group of such discs can then be discharged in the air to act as an effective decoy for heat-seeking missiles. Their effectiveness as a radar decoy is improved if the discs are given a plating of copper or silver or: one or both faces. Not more than about 0.1 mil of such plating is needed. Electroplating is preferred over electroless plating.

The pyrophorically-active discs also have good catalytic properties. For catalytic use it is generally safer to first eliminate the pyrophoricity, as by treatment with $H_2O_2$ and water as described in U.S. Pat. No. 4,443,557. An active platinum disc made by the press-sintering technique is also a very good catalyst after leaching, but eliminating its pyrophoricity is best effected by contacting it with hydrochloric acid or other mineral acid, dilute or concentrated. Catalytic platinum prepared this way has the added advantage that its content of contaminants such as carbon or iron can be kept extremely low. When preparing such catalytic platinum with an aluminum-diffusion step, the diffusion retort used to contain the diffusion materials tends to diffuse some of its constituents into the platinum. Carbon is thus frequently found in platinum and superalloys that have been given a diffusion treatment in a steel retort. The use of a diffusion-coating retort made of nickel containing less than 0.1% carbon, does prevent such carbon contamination.

When a carbon-containing binder is used to hold a masking mixture in place, it can sometimes leave a little extra carbon on the substrate surface covered by the masking mixture. While such carbon deposition is not significant in substrates that contain a substantial carbon content, such deposition can be reduced or completely eliminated for substrates that contain only a small carbon content or none at all. Thus nitrocellulose and bentonite are effective binders that leave behind little or no carbon. Nitrocellulose can thus be dissolved in nitrobenzene or nitromethane, and bentonite can be mixed with water, to each form binders to which the masking powders are added to make a masking slurry or mud.

The minimizing of carbon residue is particularly desirable when masking the so-called single crystal superalloy vanes and blades for the hot section of a jet engine The foregoing binders that do not deposit any significant carbon are accordingly particularly suited to provide slurry coatings for masking such diffusion aluminizing or masking diffusion coatings with other metals.

For best results the single crystal superalloy workpieces are masked with binder-free masking mixtures. Also for such purposes the nickel and any other metal in such masking mixtures should be free of detectable carbon. In addition the breaking in of such a masking mixture should not expose it to significant quantities of carbon. Thus the retort used for the break-in is preferably a carbon-free or low carbon content metal.

The heat generation from a pyrotechnic article is generally of relatively short duration. Thus, an iron foil 0.05 millimeter thick, after pyrophoric activation on both faces and cutting to a square 4.5 centimeters on edge, will on exposure to air with both the foil and air at room temperature, rapidly get hot enough to reach about 1280° F. and then cool down to about 350° F. in about twelve seconds.

The time dwell can be increased over 60%, by bending the foil so portions interfere with the open radiation of other portions. By way of example when the above-activated foil, before exposure to air is run through a corrugator which forms seven equally spaced corrugations each about 4 millimeters deep and then exposed and its radiation output measured the same way as the flat foil was measured, shows a maximum temperature of about 1310° F., and takes about 29 seconds to cool down to 350° F. Such a corrugated web is illustrated in parent Ser. No. 862,712. About 2 to about 4 corrugations per centimeter, each about 3 to about 6 millimeters deep, are preferred.

A similar or even greater increase in dwell is obtained by accordion-folding the activated flat foil to provide three equal-width folds joined by sharp creases in the foil. The dwell is greater when the folds are folded together to form a generally flattened accordion, as compared to pulling the accordion folds apart so the resulting foil is very much like a corrugated foil. The natural springiness of the foil can cause the folds to open a little after the folds are made.

The increase in high temperature dwell can be as much as about 200%, and is very helpful when the activated foil is used as a decoy for heat-seeking missiles. For such use it is desirable to have a dwell of at least about 15 seconds and preferably at least about 30 seconds. Dwells of that magnitude and more are readily obtained from a relatively tightly folded 4-fold accordion folded foil, or from a foil currugated to a depth of at least six millimeters with at least four corrugations per centimeter.

A feature of the corrugated and accordion-folded foils is that they nest very effectively so a large number of them can be packed into a small container such as a decoy shell that ruptures and ejects a cloud of decoy foils. The accordion fold embodiments nest with maximum packing density when they are folded flat, but they can alternatively be nested when pulled out so the nesting is like that of the corrugated embodiments. When nested flat, the accordion folds are preferably made with some springiness as noted above, so they will open a little when a nested pack is ejected into the air. Such springiness is readily provided by making the folds with minimum folding force.

Iron foils are very inexpensive starting materials from which to make the decoys, and they can be activated on one or both of their surfaces. The degree of activation is such that the foil thickness after activation is about 2 to 3 times its thickness before activation. When starting with an unactivated foil as thin as about 1 or 1½ mils, and as thick as about 3 mils, the activated and corrugated or accordion-folded foil will, when ejected in masses of about 1000 or more each about 2 to about 5 centimeters long and about 1 to about 3 centimeters wide, fall through the air in a trajectory that is very effective for decoy use. Such trajectory is steeper at altitudes of 8 kilometers than at sea level, but is suitable at both altitudes as well as at intervening altitudes.

Instead of iron foils other types of pyrophoric or pyrotechnic webs can be used. Nickel foil works about the same way as iron foils but generally shows a somewhat steeper temperature rise and shorter heat-generating dwell along with a higher temperature peak. Woven carbon fiber cloth has a lower density than metal and for use as a missile decoy is preferably about ¼ to about ¾ millimeters thick. Such cloths can be impregnated with pyrophoric powder in sufficient quantity so that when the impregnated cloth is exposed to the air, the pyrophoric powder ignites spontaneously and then ignites the cloth.

Alternatively, the carbon fiber cloth can be ignited with a pyrophoric liquid, an aluminum alkyl for example, by packing a quantity of the cloths inside a discharging shell along with tri-ethyl aluminum.

As shown in the parent applications, the carbon cloth is made easier to ignite as by etching its surface and/or coating the surface with lead or copper acetate deposited from aqueous solution. However, it can be ignited even when not pre-treated.

The carbon cloths can be folded in the manner described above for the metal foil to increase the dwell of their heat output. To retain the folds in the carbon cloth, the cloth can be impregnated with a stiffening resin, like polyethylene terephthalate or polyvinylacetate or polymethylmethylacrylate. Alternatively, the carbon fiber can be woven with stiff metal wires or can be woven through a stiff metal screen.

The radiation effectiveness of any of the pyrotechnic webs for decoy use can be substantially improved by adherently coating their surfaces with a layer about 20 to about 500 microns thick of finely divided alumina, silica or zirconia, or mixtures of any two or all three in any proportions. Thus, a 0.4 millimeter-thick web of woven carbon fiber cloth pre-treated with 0.2 molar lead acetate and impregnated with 1% to 10% activated iron powder, is immersed into a 2.5% by weight solution of poly (ethyl acrylate) resin in methylethylketone, then the impregnated cloth is withdrawn from the resin solution, dried for a few seconds and dropped into a container having a quantity of 325-mesh zirconia. The container is shaken in order to get the zirconia particles spread over the cloth, after which the coated cloth is removed and dried. When the dried product is exposed to air, the particles of activated iron ignite and ignite the carbon which then burns and the incandescence thus produced has a high concentration of radiation in the 8-to-14-micron wave length of the spectrum. A somewhat better concentration is obtained when half the zirconia is replaced by alumina.

Silica and/or silicon carbide particles can be used in place of or in mixtures with the zirconia and/or alumina.

The particles can be applied to the carbon cloth web by spraying on it a slurry of the particles in the resin solution. It is preferred that the slurry contain a high concentration of the particles, about 10 to 50 time a the weight of the resin.

A preferred technique is to take a flat carbon fiber cloth about 0.5 millimeter thick and pre-dipped as noted above in aqueous lead acetate and then dried, coat one of its faces with a spray of 90 parts by weight of a 1:1 mixture of 325-mesh $ZrO_2$ and $Al_2O_3$ slurried in 100 parts by weight of a 2 weight percent solution of poly (methylmethacrylate) in acetone. The coating is built up to a thickness of about ¼ millimeter, and then permitted to dry. On the opposite face of the cloth there is sprayed on, in an argon atmosphere, about a 70 micron-thick slurry of activated iron powder particles about 10 microns in size, in twice its weight of a 3 weight percent solution of poly (ethyl acrylate) in acetone. This coating can be as much as 300 microns in thickness. For such top coatings the volume of inorganic solids should be at least 80% of the total volume of the dried coating.

The second coating is dried in the argon atmosphere and still in that atmosphere is given a top coating of the $ZrO_2$-$Al_2O_3$-binder slurrY, about ⅓ the thickness of the original $ZrO_2$-$Al_2O_3$-binder coating, and again the coated cloth is dried in the argon atmosphere. One or more of such coated cloths can be sealed in a plastic bag or decoy shell and will keep until needed for decoy use. At that time, the cloths are exposed to air and will spontaneously ignite. They show a very good thermal radiation in the 8-to-14 micron band. The face carrying the thicker $ZrO_2Al_2O_3$-binder coat shows stronger radiation in that band than the face carrying the thinner such coat.

Even better frequency distribution of the pyrophoric radiation is obtained when the pyrophoric surface coating is borosilicate or borochromate particles in which the boron oxide content is from about 5% to about 80%, preferably at least 25%, and most preferably at least about 50%.

About a 1/10 to 15-mil thick layer of pyrex glass particles ground to about 200 mesh and adhered to one face of a 5 to 30-mil thick carbon fiber cloth, provides a radiation pattern particularly desirable for decoying heat-seeking missiles. A little of the above-mentioned binder solution can be used to secure such coating in place, so that all that is needed is to spray on the binder solution containing the powdered glass particles suspended in it, and then permitting the sprayed-on coating to dry.

The sizes of the individual glass particles should be from about 10 to about 100 microns.

A still further improvement in the foregoing radiation characteristics is obtained when a layer of aluminum particles is interposed between the powdered oxide coatings and the carbon fiber cloth. Such aluminum layer can be from about 1/10 to about 1-mil thick, can consist of aluminum particles also about 10 to about 100 microns in size, and can be applied the same ways described above the the oxide particles. Drying of the binder-containing aluminum particle layer permits the spraying over it of the glass particle layer without excessive smearing of the aluminum particles. Aluminum alloys containing at least about 80% aluminum can be used in place of pure aluminum.

EXAMPLE 2

A very effective coated and self-igniting carbon fiber cloth is prepared by starting with a 16-mil thick cloth that is activated by pitting and coating with lead acetate in accordance with the prior art. On one face, there is applied a ½-mil thick layer of aluminized particles, which is dried and followed by a 11.5-mil thick layer of particles of the following glass composition, by weight:

| | |
|---|---|
| 72% | $SiO_2$ |
| 25% | $B_2O_3$ |
| 0.5% | $Na_2O$ |
| 1% | $Al_2O_3$ |
| 1% | $K_2O$ |
| 0.5% | $Li_2O$ |

The resulting material is dried again and is now placed in an argon box. While in an argon atmosphere the uncoated cloth face is sprayed with a 8-mil or 16.5-mil thick layer of 325 mesh pyrophoric iron particles, dried and the pyrophoric layer than top-coated with a 0.5-mil thick layer of the same glass particles previously applied. Another drying step, still under argon, completes the product. When that completed product is exposed to air, its pyrophoric coating promptly ignites and then ignites the carbon fibers of the cloth. The entire cloth burns away and in doing so very effective radiation is generated.

The last borosilicate layer can be omitted without seriously detracting from the radiation effectiveness.

Another borosilicate that can be used is a simple pyrex formulation of:

| | |
|---|---|
| 80.6% | $SiO_2$ |
| 13.8% | $B_2O_3$ |
| 4.0% | $Na_2O$ |
| 1.6% | $Al_2O_3$ |

Simple mixtures of $B_2O_3$ and $SiO_2$, as well as of $B_2O_3$ and $CR_2O_3$ are also effective, but are not as effective unless sintered or fused together. Such simple mixtures also tend to be hygroscopic when their $B_2O_3$ content is over about 50%, and should be appropriately handled until they are sintered or fused. A fused mixture of 65% $B_2O_3$ and 35% $SiO_2$ is very effective for radiation adjustment.

Solutions of other tacky resins such as other acrylic resins, polyvinylacetate, polyurethanes, silicones and pressure-sensitive resin formulations can be used in place of the noted poly acrylates. Suspensions of resins in liquids in which they do not dissolve are not particularly effective. However the top coatings can be suspended in an excess of colloidal silica or colloidal alumina dispersions, and applied in this form with or without organic binder.

Where an aluminum alkyl is used for ignition in place of the activated iron, the adhesive resin should not be one in which the alkyl dissolves.

Activated iron or nickel particles, when used, can be applied to the carbon cloth by the techniques described for the zirconia, or the resin-to-activated-powder ratio can be diminished and even reduced to zero. Thus, a resin-free slurry of very finely divided activated powder in water can be sprayed onto one or both faces of the carbon cloth to deposit about 1/50 to about 1/10 gram of the activated powder per square centimeter of cloth surface. After a little drying in argon, there is then sprayed over both faces of the particle-carrying cloth, a slurry of zirconia powder. The binder in the zirconia slurry then holds the activated powder particles in place, and such a coating not over about 100 microns thick does not prevent their pyrophoric reaction when the coated cloth is exposed to air.

The activated iron or nickel particles can alternatively be formed into foils with the help of a binder such as a resin like an acrylate or a polyester. Thus a quantity of pyrophorically activated iron powder in which the particles range in size from about 100 to about 250 microns is stirred into a 10% solution of polyethyl acrylate binder in methyl chloroform, in a proportion of about 4 to 5 parts of the powder to each part by weight of the solid binder. The resulting suspension is stirred and sprayed onto a flat surface of polished aluminum or polyethylene to build up a generally uniform layer about ½ millimeter thick. That layer is then permitted to dry in an argon atmosphere to yield a solid, self-supporting film about 250 microns thick that is readily pulled away from the aluminum or polyethylene surface against which it was cast. That film can then be cut into strips 3 to 10 millimeters wide which when exposed to air generate heat and act as decoys. The strips are also of relatively low density so that after being discharged into the air with or without other decoy strips and chaff, they flutter down.

Thinner strips, such as those that are about 100 microns thick, are somewhat more effective decoys. However the strips can be as thick as ¾ millimeters, and the pyrophoric particles similarly thick.

More effective are strips cut from film that is porous. To prepare such a porous product, the cast suspension has its solvent volatilized away under conditions that cause the solvent to boil. Thus the cast suspension can be inserted into a container which is evacuated to about 1/100 to 3/100 bar to cause bubble formation as the solvent is withdrawn from the layer. Alternatively any of the usual resin-blowing agents used to convert resins to foams can be mixed with the suspensions so that on drying, particularly at elevated temperatures, the suspension layer dries to a porous film.

A more preferred alternative is to roll or press the pyrophoric particles into a film of binder that is soft enough to permit the particles to at least partially penetrate, and adherent enough to hold onto the particles that so penetrate. Low density polyethylene heated to about 50° C. is suitable, as is open-celled or closed-celled microcellular foams of polyethylene or polypropylene or polystyrene or polyvinyl chloride. Such films and foams are available in thicknesses of about ¾ millimeter or less, and can be warmed and/or plasticized to make them softer and more adherent. Temperatures over 50° C. and high pressures are to be avoided inasmuch as they can cause pyrophoric particles to explode even in the absence of oxygen.

A ¾ millimeter thick ribbon of open-celled microcellular polyvinyl chloride foam can thus be coated with a ¾ millimeter high layer of pyrophoric iron particles about 200 to about 800 microns in size, and the unheated coated foam passed in an argon atmosphere through the bight of a pair of steel rollers each five centimeters in diameter spring-urged together by a force of about 10 kilograms. Most of the particles become locked in place in the foam to yield a product having good decoy characteristics. Most of the locked-in particles have at least some of their surfaces exposed so that they pyrophorically react more vigorously than when cast in suspension in a binder solution.

The thermal radiation produced by the foregoing films is of relatively long wave length, and that radiation spectrum can be adjusted for better decoy use by top coating the films with the very finely divided borosilicate and other adjusting materials described hereinabove. These very finely divided particles can be sprinkled onto a sticky film surface, such as that of a heated or incompletely dried film, so that they adhere to the final surface. The thickness of the layer of spectrum adjusting powder should be less than about 10 microns to keep from materially blocking access to the air.

It should be noted that the pyrophoric particles can be prepared by leaching aluminum from iron or nickel aluminides such as the commercially available ground Raney alloys, or by diffusion aluminizing iron or nickel powder, or by sintering such powder with aluminum, as in Example 1.

The pyrophoric metal foils of the present invention can be prepared in large quantities by the use of the open-coil activating technique described in U.S. Pat. No. 4,443,557. A number of individual activating retorts can thus be loaded with an open coil of iron foil, and with the mixture of 20% powdered aluminum and 80% powdered alumina, along with about ½% to about 1% of AlCl₃ or CrCl₃ activator. The individual retorts so loaded are moved through a furnace as described in connection with FIG. 4 of U.S. Pat. No. 3,903,338, so the contents of each retort reach about 1200° F. for about ½ to about 1 hour. Better results are obtained at lower temperatures and longer times, as for example, 900° F. for 16 hours.

After cooling, the aluminized foil is reacted with aqueous caustic containing dissolved tin as described in the parent applications to leach out some of the aluminum which had diffused into the foil.

Alternatively, the foil can be activated by continuous reeling of a long length through a retort as shown in U.S. Pat. No. 4,435,481. As there described, the activation can be effected on one or both faces of the foil. The mixture of powdered aluminum and powdered alumina should have at least 40% alumina by weight, inasmuch as smaller proportions of alumina will permit some of the powdered aluminum, which melts during the treatment, to wet the foil. This is undesirable inasmuch as it blocks the activated diffusion of the aluminum into the iron. Such activated diffusion brings much more desirable results than diffusion from a melt coating.

The Raney activated iron and nickel or alloys of these two as well as of cobalt can have their heat generation and high-temperature dwell increased by subjecting them to a very short treatment in dilute acid. An aqueous or non-aqueous solution of inorganic or organic acid having a pH of about 1 to about 4, preferably about 1.5 to 3.5 is effective, and stronger acidities are not as effective. The dip need only be about ⅛ minute long after gasing starts, but longer dips do not significantly detract from the effects unless the acid used is a strong mineral acid.

A 5-minute dip in 1% to 10% citric acid in water of freshly activated 4-mil thick iron foil, the leaching of which was effected in the presence of tin, increases its maximum pyrophoric temperature by about 90° F., and increases the dwell at or above 1200° F. from about 1.5 seconds to about four seconds. The dwell at or about 1150° F. is increased from about 2 seconds to about 4.8 seconds, and the dwell at or about 1100° F. from about 2.6 seconds to about 5 seconds.

A corresponding dip in 1% to 10% aqueous succinic acid produces about the same results, and similar acetic acid treatment effects only slightly smaller increases. Hydrochloric acid at 7% concentration in water is not quite as effective as 10% aqueous acetic acid. Other acids that can be used are chloracetic acid, formic acid, lactic acid, maleic acid, malonic acid, p-nitro benzoic acid, phosphoric acid, picric acid, salicylic acid, sulfuric acid and tartaric acid. Any acid capable of supplying a pH of between 1.5 and 4. is appropriate. However, acids like nitric acid attack the substrate very rapidly and contact with such acids should be held down to about ¼ minute.

The acids can be dissolved in lower monohydric alcohols such as methanol, ethanol or isopropanol or in mixtures of such an alcohol with water, and still provide the increase in maximum pyrophoric temperature and high temperature dwell. Organic acids are preferred, particularly the polycarboxylic acids.

The dips can be effected at any temperature from about 20° F. to about 210° F., but ordinary room temperatures of about 60° F. to 90° F. are easiest to use. Pyrophorically activated iron screens also show corresponding improvements in maximum pyrophoric temperature and high-temperature dwell. Such improvements of activated iron is obtained whether or not tin is used during its leaching.

Combining the acid dip with the folding described supra provides greater increases in dwell at the higher temperature.

Such increases are particularly desirable in the use of the activated materials as decoys for heat-seeking missiles. For such use, the Raney-activated and acid-treated metal is preferably a foil between about 2 and about 6 mils thick. As noted, the folding increases the foregoing high-temperature dwells at least an additional 60%.

The activated metal foils can also be coated with a binder-containing slurry of particles, such as those described above, that shift the pyrophoric radiation toward the 8-to-14 micron range, or away from the 2.6 micron band. Borosilicate particles desirably reduce the radiation in the lower than 3-micron band as compared to that in the higher than 3 micron band. The slurry should contain solid particles in an amount from about 10 to about 50 times the weight of the binder, and the coating should not be over about 100 microns thick on at least one face of the foil.

For activating a long length of iron or nickel foil, its surface can be aluminized by first depositing powdered aluminum on it as the foil is reeled past a depositing station, and then subjecting the thus coated foil to diffusion conditions to diffuse the aluminum into that surface. The particles of powdered aluminum, less than 250 mesh in size, can be poured onto the surface being coated, or they can be electrophoretically deposited from a suspension in benzene or a 2:1 by weight mixture of isopropanol and nitromethane, or the like. Electrophoretic potentials of about 50 to 200 volts are adequate with suspensions containing about 2 to about 10% aluminum and at temperatures of up to about 80° C. Suspending agents like zein or other proteins, in a concentration of 0.1 to about 0.3 percent by weight can also be included in the suspension.

A little $Al_2O_3$ or other inert powder may be mixed with the aluminum powder to improve the diffusion when the coated foil is subjected to diffusion conditions, particularly at temperatures that cause the aluminum particles to melt. As much as 40% inert material can thus be present, although such material can be completely omitted.

$AlCl_3$ or water-insoluble $CrCl_3$ make very effective activators when diffusion is effected below about 1100° F. At higher temperatures $NH_4Cl$ is preferred. These activators can in powdered form be mixed with the aluminum to the extent of about ½ to about 1% by weight.

Long lengths of activated foil are conveniently cut into the desired pieces or chaff, by doing the cutting while the foil is covered by water or other protective liquid that prevents pyrophoric action. A body of the liquid can first be degased to remove dissolved oxygen, and the leached foil, with or without prior rinsing, introduced along with a rotary chopper, punch, or other cutting tool. The cut pieces or chaff are accumulated in the body of liquid. The cutting tool may have to be operated at a speed substantially less than that used when the tool is not submerged in a liquid.

The rotary chopper cuts transversely across the introduced foil to produce transverse strips having lengths equal to the width of the introduced foil, and having widths that are controlled by the speed with which the foil advances to the chopper and can be as little as one millimeter or as large as about one centimeter. If desired the foil can first be fed through a slitter, also submerged, that cuts longitudinally through the foil to sever it into narrower lengths.

A punch can provide punched-out pieces of almost any shape.

The above-mentioned aluminizing can be effected in very short times by heating a workpiece embedded in an activated powder pack, with a thermal input that brings it to diffusion coating temperature and completes the diffusion coating all in about 50 minutes or less. During this short interval the activator present in the pack begins to be volatilized at a relatively rapid rate that persists about 45 minutes, even if only present in the pack at a concentration of 0.5% by weight, and the formation of the diffusion coating case is extremely rapid. Thus, a ½-mil aluminized case is produced only about 30 minutes after starting to heat a workpiece to 1800° F. in a pack of:

| | |
|---|---|
| 10 parts by weight | Aluminum powder about 100 microns in size |
| 90 parts by weight | $Al_2O_3$ about 100 microns in size | with 0.5% powdered $NH_4Cl$ mixed in based on the weight of the pack, if the workpiece reaches 1800° F. in 15 minutes.

It is preferred to have the workpiece covered by no more than about ½ inch of activated pack when it is heated, inasmuch as the pack acts as thermal insulation and slows down the penetration of the heat to the workpiece from the walls of the retort in which it is held during the heating. With the workpiece embedded in a pack held in a cylindrical retort having a 7-inch length and a 2-inch diameter, so that about ½-inch pack thickness envelopes the workpiece, heat supplied at the rate of at least about 200,000 BTU per hour per pound of workpiece will effect the desired heat-up to temperatures as high as 1800° F. During such heat-up the retort can have one or both its ends loosely covered to permit escape of gases, and can be held in a larger retort through which hydrogen or argon is flowed at a slow rate to flush out the escaping gases.

It is not necessary to arrange the workpiece so that it comes to within ¼ inch of the retort as described in U.S. Pat. No. 3,824,122. Indeed, the presence of a ½-inch thick pack covering is preferred when practicing the rapid diffusion coating of the present invention inasmuch as it assures the presence of sufficient energizer even when the energizer content of the pack is only 0.5% or less by weight. The energizer content can be increased, for example, to 1% or 2%, and energizer can be additionally or alternatively added to the metal powder deposited on the wall of a narrow passageway to be diffusion coated.

A retort packed in accordance with the rapid diffusion coating technique can contain a number of workpieces and there is no need to position each workpiece into its own carefully dimensioned closely fitting retort as in U.S. Pat. No. 3,824,122.

Diffusion coating at temperatures no higher than about 1000° F. is even more readily accomplished in short periods of time—not over 45 minutes of heating is generally needed to bring the workpieces to temperature and obtain an aluminized case at least 1 mil thick. Thinner cases require only about 30 minutes or even less. Zinc and aluminum can both be very effectively and very rapidly diffusion coated into other metals at the foregoing low temperatures.

To further save time, the retort cooling is best effected by withdrawing it from the furnace in which the heating has been carried out. Exposed to the ambient air and with the help of the flushing gas stream between the retorts, the cylindrical retort assembly described above cools in about 15 minutes to the point that the outer retort can be opened and the inner retort withdrawn, exposed to the atmosphere and emptied. In this way the entire diffusion coating sequence, including the completion of the cool-down, takes only about an hour or 65 minutes. This compares with the 1½ hours disclosed in U.S. Pat. No. 3,824,122 for just the heating time. The cool-down can also be accelerated by blowing air over the cooling retort assembly or by lowering it into a quenching liquid such as water.

U.S. Pat. No. 3,117,846 suggests a powder pack diffusion heating for ½ hour, but that time does not include the time needed to bring the powder pack and the workpiece to the diffusion coating temperature. Such heat-up time is generally a number of hours if the continuous treatment technique of U.S. Pat. No. 3,824,122 is not used.

Pack chromizing is generally not conducted at temperatures below about 1100° F., so that it can be completed as rapidly as the most rapid pack aluminizing. A 300° F. or 400° F. increase in diffusing temperature only takes about five minutes longer to attain by the foregoing heat-up technique.

The foregoing very rapid diffusion coating technique is particularly suited for preparing pyrophoric articles such as cut foils. A mass of such articles can be mixed up with the diffusion coating powder and very quickly aluminized as a batch. The aluminized articles can then be sifted away from the powder and leached to remove enough aluminum to make them pyrophoric.

On the other hand a long length of 2-mil thick AISI 1010 steel or Armco iron foil can be unwound from a supply reel, subjected to the activation, and then wound up on a take-up reel with the entire activation sequence taking less than thirty minutes. Steel foils containing a carbon stabilizer such as titanium, columbium or vanadium in an amount about 6 times that of the carbon, are particularly desirable.

The first step in the activation sequence is preferably a surface cleaning as by blasting with glass beads or fine sand or solvent, and/or electrolytic or non-electrolytic alkaline cleaning. Heating of the foil can be initiated as it is unreeled and before, during or immediately after the cleaning step. The heating is then continued as the moving foil goes through a diffusion aluminizing by spray coating with molten aluminum as it heats up to 1450° F., and is then held at that temperature for about ten to forty minutes. Doing the diffusion at 1450° F. takes at least about twenty minutes to develop an effective diffusion case. A plasma spray can also be used to apply the aluminum.

After the diffusion has proceeded to the desired extent, the foil can go directly through a cool-down and then through a leaching solution. A very desirable leaching for 1010 steel is with a 10% aqueous solution of NaOH or KOH held at 170° F. to 212° F. Only about three minutes are generally needed. Keeping the leaching solution below 140° F. may call for the leaching to take as long as thirty minutes or a little longer. Leaching solutions having 15 or more percent caustic act more rapidly. About 1 to 2 grams of tin as sodium stannite is preferably present per liter of leaching solution, and somewhat less when the leaching is at the higher temperatures.

The leached foil is now in activated condition and can be wound onto the take-up reel with or without a rinsing off of any of the leaching solution dragged out by the moving foil. Rinsing is preferred, particularly where the leached foil is to be stored for more than a few hours. Prolonged contact with residual leaching solution diminishes the activity of the leached product and also tends to decrease the adhesion of the activated surface to the core of that product. The activity of the activated surface is preferably preserved by confining the leached product in an inert atmosphere such as nitrogen or argon, or by covering it with a protective liquid like glycerine. Volatile liquids like acetone and nonane will also protect the activity, but need to be in closed containers to prevent their escape.

All of the foregoing manufacturing steps can be conducted in an enclosed, generally gas-tight chamber as described and illustrated in Ser. No. 281,405, and as there shown the preliminary cleaning step and the leaching and take-up reeling can, if desired, be outside the chamber.

The leaching generates substantial quantities of hydrogen that can be used to flush out the atmosphere in the chamber and thus help protect the heated foil from attack by water vapor or steam generated from the leaching solution and from an electrolytic or non-electrolytic cleaner. A complete coating of liquid aluminum also protects the incoming steel and iron foils even at 1650° F. However, a hydrogen-rich atmosphere presents the danger of explosion, and it is accordingly desirable to inject into the treatment chamber a stream of inert gas such as argon or nitrogen at a rate that keeps the chamber atmosphere below its explosive limit.

At the present state of the art the diffusion coating step cannot be made as rapid as the other steps in the activating sequence, and so is the primary timing factor in that sequence.

By way of example, a one-meter-long induction coil furnace can be provided for coated foil to move through at the rate of two meters per hour, followed by a five-centimeter gap through which the foil cools by radiating its heat to the surroundings, and then a ten-centimeter travel through a leaching bath held at 190° F. Following that bath the foil moves through a falling stream of rinse water that terminates the leaching, rinses off the leachant, and cools the foil to about room temperature. The water-wet foil can then be dried under argon and spooled.

There is generally no need to use a diffusion coating energizer such as ammonium chloride in the atmosphere adjacent the surface being diffusion coated by the foregoing technique, but it can be used and will then help if the incoming coil has not been completely cleaned. Blasting with a stream of blasting grit generally does an adequate cleaning. With or without an energizer in an inert or reducing diffusion atmosphere, a continuous spray of aluminum on a continuously fed foil, or a continuous passage of such a foil through or on a body of molten aluminum, does not objectionably roughen it.

However, the smoothness of the sprayed-on aluminum layer does not assure suitable diffusion aluminizing when the diffusion step is conducted at elevated temperatures, i.e., above 1300° F. Thus, a two-mil thick 1010 type steel when sprayed with molten aluminum and rapidly heated to 1450° F. where it is kept for 30 minutes and then cooled, becomes wrinkled and distorted. A similar distortion problem is experienced by a 10-minute diffusion heat at 1600° F. Such wrinkling and/or distortion makes it awkward to manipulate the foils, but essentially entirely disappears during the leaching, and so does not significantly prevent the tight packing of such activated foils in containers for use as thermal decoys as described, for example, in Ser. No. 281,405. Sprayed-on aluminum coatings weighing from about 5 to about 30 milligrams per square centimeter, whether sprayed on as molten aluminum or as a slurry of aluminum particles, lead to the wrinkling and distortion.

For activating only one face of the foil, the other face can be protected or masked against diffusion, or the aluminum spray coating can be confined to the one face to be diffusion coated. This also leads to distortion and wrinkling.

Pre-alloying the aluminum with 5% to 15% silicon by weight reduces the wrinkling and distortion, but does not eliminate them completely. However, the diffusing in of a pre-coated foil yields after leaching an activated product having a thermal output when exposed to air, somewhat less than that of foils prepared by pack diffusion. Alloying with other materials such as zinc, calcium, germanium, magnesium, nickel and boron, also reduces the wrinkling and distortion but has less of an adverse effect on the thermal output. Conducting the leaching at elevated temperatures such as over 220° F., and particularly with aqueous solutions of at least 20% caustic soda or potash by weight also helps.

Wrinkling and distortion can also be reduced by conducting the diffusion at lower temperatures. Below about 1000° F., the wrinkling and distortion is completely prevented, but the diffusion time is increased to as much as four hours or more. At these low temperatures pack diffusion with anhydrous water-insoluble $CrCl_3$ as energizer, is preferred.

By activating only one face of a foil, the activation can be made to penetrate most of the way through the foil thickness, leaving only about 20% of that thickness as a structural backbone. The unactivated face of a stainless steel or plain iron foil can be plated with aluminum to improve its radar reflection characteristics. The so-called Schoop aluminizing with a spray of molten aluminum is effective to deposit an aluminum film only about 0.1 to 0.3 mils thick on the back of a roll of activated foil as it is unspooled and then respooled in an Argon box. A layer of copper or even silver can be similarly deposited in place of the layer of aluminum Copper and silver are not attacked by leaching baths, so that they can be deposited before or after the leaching.

The radar reflectivity associated with pyrophoric foils is also increased by mixing them with standard aluminum radar chaff or foils. Such aluminum foils or chaff only about ½ mil thick or thinner, mixed with two to five times as many pyrophoric one-inch discs of iron foil, make an effective heat and radar decoy when ejected as a mass from an exploding cartridge. The aluminum foil can be thread-like slivers only about 1 millimeter wide or less, to further improve the decoy action. Chaff made by chopping up aluminum-coated plastic or glass fiber, foil or thread is particularly helpful.

Decoy action can also be improved by discharging mixtures of pyrophoric materials in which some of the materials ignite very promptly, and some take a little longer. Thus powdered activated iron or nickel reach radiation temperature in less than a second, whereas foils and binder-containing materials take more than a second. Alternatively the materials can be discharged in successive bursts of smaller quantities to thus prolong the effective radiation.

An alternative technique for preparing activated foil is to apply a Raney type layer to one or both faces of a foil substrate, using a sintering technique. Thus a mixture of nickel and aluminum powders the particles of which are from about 1 to about 12 microns in size, are in a proportion of 3 atoms aluminum to 1 atom nickel slurried in a 2% solution of polyethylacrylate in methyl chloroform, and the resulting slurry sprayed onto a 50 micron thick steel foil to build up a coating particle thickness of about 25 to about 50 microns on each face. The thus-coated foil is then dried to volatilize off its solvent content, and then embedded in a pack of chromium granules held in a metal retort. A stream of argon is flushed through the retort and then replaced with a stream of hydrogen, while the retort is heated to about 815° C. for about 90 minutes. The retort is then cooled and the coated foils removed. They now show rough sintered-on metal faces which when leached as described above show excellent pyrophoric action.

The nickel and aluminum particles are known to inter-react very aggressively, and the retort heating time can be reduced to as little as 5 minutes or even less. It takes a very few minutes for the powders to reach their interreacting temperature of about 300 degrees Centigrade, and once they start to inter-react they generate sufficient heat to take the coatings to above 750° C. to thus complete the sintering to the substrate foil. That substrate can be as thin as 10 microns to further increase the final pyrophoric heat output.

It is not necessary to use a retort. A preheated tube through which argon or hydrogen flows can have passed through it a foil carrying on one face the foregoing coating. In only about one minute the nickel-aluminum reaction takes place to leave a sintered-on product that after leaching shows excellent pyrophoric action.

Steel foil is a very inexpensive substrate, but other metal substrates such as nickel or copper foils can be used.

Iron powder can be substituted for the nickel powder, preferably with the iron-aluminum atom ratio of 1:2, and similar results are obtained. However the reaction between iron powder and aluminum powder is not as aggressive and requires a somewhat higher heat-up temperature.

Cobalt can also be substituted for the nickel, without changing its proportion to aluminum.

The chromium granule bed can be replaced by a bed of powdered alumina, and the hydrogen flush by a helium or argon flush, without significantly altering the results. The retort atmosphere need not contain any diffusion activator to improve the sintering action.

Where a foil with only one pyrophoric surface is desired, the nickel and aluminum particles can be applied with or without a binder, to the top of a horizontally oriented substrate foil, and as above noted the powder-carrying foil heated to reaction temperature without embedding it in a pack. The retorting time for such a treatment is reduced to less than 15 minutes, inasmuch as there is no pack to heat up.

The foregoing powder-sintering techniques are particularly suited for preparing pyrophoric foil on a continuous basis. Thus a ½, 1 or 2-mil thick substrate foil can be unspooled and passed through gas seals into and out of a heated hydrogen-filled retort in a relatively cool portion of which the inter-reacting powders are poured onto the foil. After the desired dwell in the hot part of the retort the powder-carrying foil is pulled out and then through a leach bath where the leaching is completed in about the same length of time as the sintering so that the sequence can be realistically conducted using a retort path as short as ½ to 1 meter to achieve a high output rate.

Where the final foil is desired to have both surfaces pyrophoric, the sintering step can be repeated with the substrate foil held upside down and a fresh sintering mixture applied to the surface that now faces upwardly.

The proportions of aluminum to nickel or iron can be varied about plus or minus 20% with little loss of effectiveness. Moreover the sintering powder can have its nickel and iron mixed together in any proportion to vary the pyrophoric action. Also the final foil can be made with activated iron on one face and activated nickel on its other face. The activated nickel pyrophorically reacts more sharply but that reaction is completed in substantially less time, so that the dual coatings work a balancing of the reactions on their separate faces.

The foregoing sintering is preferably conducted with reacting particles no larger than about 50 microns. The smaller the particles the more rapid and effective is the sintering, and the use of high heating temperatures such as 1000° C. also helps.

The pyrophoric output of activated iron foils or powder is increased when the leaching step is conducted with a little hydrogen peroxide in the leaching liquid. As little as 0.1% $H_2O_2$ by weight of the leachant is enough to show such results, and from about 0.2% to about 0.5% is preferred. Concentrations of 3% or higher tend to darken and diminish the pyrophoric activity.

By way of example, to a 20 weight percent solution of NaOH in water there is added 0.2 weight percent $H_2O_2$, and the resulting mixture at room temperature is used to leach 2 mil thick iron foil that has been aluminized to a depth of ½ mil on both its faces. The leaching generates a very small amount of gas as compared to corresponding leaching without the $H_2O_2$, and is completed in about 30 minutes even if the leach solution warms up to about 50° C. during the leaching.

About the same leach time as in the above illustration is required when the leachant is KOH and starting leach solution is at any temperature from about zero to about 50° C., although leachant that starts at 50° C. can heat up to about 60° C. The foregoing leachings are conducted with about one hundred times as much leach solution as substrate being leached, by weight. Preferred caustic concentrations are from about 8% to about 20% NaOH or KOH in water, by weight.

Instead of pouring $H_2O_2$ into a leach solution, peroxides such as sodium peroxide, potassium peroxide and calcium peroxide can be added to the leach solution to form $H_2O_2$ in situ.

The foil activated in accordance with the foregoing example also shows about 15% more heat output and about 50° F. higher maximum temperature rise than the corresponding foil activated without the help of the $H_2O_2$. Iron powders also show about the same improvements as the foils do.

Leaching of aluminized iron, either foil or powder, is best conducted with some tin or stannite ion dissolved in the leachant, but the concentration of the tin can be reduced to as little as about ½ gram dissolved tin per liter of leachant when the $H_2O_2$ of the present invention is present in the leachant. Preferably the dissolved tin content is as high as 1 gram per liter. Such tin reduction is also noted in the rapid high-temperature leaching of parent Ser. No. 707,656, U.S. Pat. No. 4,824,482.

Not only is less tin needed in the leachant, but the iron activated with the $H_2O_2$ in the leachant contains less tin than is contained in iron activated pursuant to the prior art. Such tin is introduced as metal into the pores of the activated iron and even in very small amounts helps preserve the activation.

It is noted that the presence of the $H_2O_2$ in the leachant according to the present invention, has an effect opposite to that of the $H_2O_2$ when it is applied to the activated metal after the leaching is completed. Such later application causes the activated metal to lose some or all of its pyrophoricity, and to turn black.

The increase in heat output caused by the presence of the $H_2O_2$ in the leachant, can be heightened by subsequently subjecting the activated metal to the short treatment with dilute acid, with or without the folding, as described above.

Pyrophorically activated nickel, particularly in the form of foil, tends to become passivated in an unpredictable manner. When this happens the material remains activated but will not react with the air unless it is heated to about 50° C. or higher.

It has now been discovered that this passivation tendency can be reduced or completely avoided if the leaching step in the activation is conducted at temperatures at least as high as 90° C., and the higher the better. The concentration of caustic in such leaching bath can be as low as 5% by weight, and the time at such elevated temperatures should be at least about 15 minutes. Thus a boiling solution of 10% NaOH in water will leach most activated nickel foils in about 30 minutes to yield a very active product showing no tendency to passivate. Shorter leaching times give a somewhat less active product that still does not passivate unless the leaching time is less than 15 minutes.

Aluminizing can be used to prepare aluminized steel, iron, nickel, stainless steel or other substrates for conversion to Raney-type activated metals, as described in U.S. Pat. 4,154,705. Both self-supporting substrates and powdered substrates can be so activated and such activation of powders is described in parent application Ser. No. 507,174. This type of treatment provides the greatest degree of activation for foils or other self-supporting substrates when the aluminizing is effected at the lowest temperatures—below 1000° F.—and at such low temperatures energizers such as inexpensive ammonium halides give undesirable diffusion cases.

The pyrophoric effects of the Raney-type activated metals is further improved by diffusing boron into the surface being activated. This is shown in the following example:

EXAMPLE 3

Three-hundred grams of powdered 325 mesh $FeAl_2$ is thoroughly mixed with 10 grams powdered boron and 6 grams of powdered $NaBF_4$. The mixture is placed in a carbon steel retort which is then fitted into a tube furnace, and heated while a flushing gas is passed through the tube as in Example 1. A heat of 1800° F. held there for 1½ hours under hydrogen, introduces about 7% boron into the $FeAl_2$ powder, based on its iron content.

The retort contents are partially sintered together as a result of the diffusion heat, but can be fairly easily removed from the retort after banging the outside of the retort with hammers or mallets. Crushing and/or grinding readily reduces the mass to very small particle size. Then on leaching aluminum out of the resulting product mass as by a 60-minute treatment in 15–16% aqueous NaOH that is cooled to keep it below 120° F., followed by washing, the activated particles remaining are quite pyrophoric and on exposure to air heat up to temperatures of about 1000° F. Higher and lower leaching concentrations and temperatures can also be used, but are less desirable.

Longer diffusion boronizing provides, after leaching, an activated iron-aluminum-boron alloy powder containing as mush as 30% boron based on the weight of its iron, and which upon exposure to air heats up to over 1200° F. Boron contents greater than about 30% provide decreasing heat-up and at about 40% leave the leached powder non-pyrophoric. It is preferred that the boron penetrate through the entire thickness of each powder particle and that each particle have a uniform composition throughout its thickness.

Similar results are obtained when FeAl$_3$ powder is used in place of the FeAl$_2$, when alloys of intermediate proportions are used, and when the corresponding nickel-aluminum alloys are used. Some of the alloys are not as brittle, and therefore not as easily grindable as others. If the iron-aluminum alloy powder particles being boronized are over about 1 millimeter in size, the boronizing treatment times should be substantially lengthened if the boron penetration is to be complete. Other boronhalides such as ammonium fluoborate, BBr$_3$ and BI$_3$ can be used as energizers. In general the energizer content of the pack should be from about 1 to about 3% by weight, and the diffusion temperature at least about 1400° F.

By not using an inert refractory diluent in the boronizing pack, it becomes unnecessary to later separate such diluent from the boronized powder.

The foregoing boronizing of self-supporting substrates such as foils requires much more care and should be conducted with inert refractory diluent in the pack. Thus conducting the same boronizing on lengths of one-mil thick aluminized iron foil is awkward because such foil is extremely brittle and difficult to handle. The following is a preferred example.

EXAMPLE 4

Such boronizing can be satisfactorily effected in the following powder pack:

| | |
|---|---|
| 200 grams | powdered alumina |
| 10 grams | powdered boron |
| 5 grams | sodium or ammonium fluoborate, | at 950° F. for 18 hours, or at 1050° F. for 3 hours, in a hydrogen-bathed atmosphere. The boron then penetrates about half way through the aluminized case.

Aluminum loss to the boron in the pack also takes place. The aluminizing of an iron-boron alloy in an attempt to introduce sufficient aluminum to give a pyrophoric product after leaching, causes excessive loss of boron from the substrate to the pack.

The activated powders containing boron, or even free of boron, are stored out of contact with air or oxygen to preserve their pyrophoricity. Water is not a suitable preserving liquid for the activated boron-containing powders. Acetone preserves them for at least three weeks, as does an azeotropic mixture of trifluorotrichloro ethane with methylene chloride, described in U.S. Pat. No. 2,999,817. Ordinary fluoro-chloro ethanes and methanes that are normally used as refrigerants or propellants are also suitable and they can be used by themselves or mixed with each other or with acetone. Mixtures of the activated powders with preserving liquids that are also propellants, are particularly desirable in that they can be packed in an aerosoltype container from which they are readily discharged to provide a cloud of pyrophorically oxidizing particles.

According to the present invention, there are provided pyrotechnic compositions which ignite at temperatures above 100° C., e.g., at about 300° C., and have a substantial aluminum content as well as a high thermal output. These compositions are activated aluminides of metals like molybdenum, zirconium and columbium that when not combined with aluminum ignite in air at about 500° C. to 700° C. at atmospheric pressure. These metals are easily combined with aluminum to form alloys or aluminides having two or more atoms of aluminum for each atom of ignitible metal, and when so combined generally have ignition temperatures not much different from that of the pure ignitible metal as noted above. Incorporating about 2% to about 10% boron in such alloy, based on the weight of the ignitible metal, generally lowers the ignition temperature by about 20° C. However, the ignition temperature of the aluminide with or without the boron, is lowered about 100° C. to about 150° C. by activating the aluminide.

The activation of the present invention is the leaching out of some of the aluminum, as with aqueous caustic soda or caustic potash. For this activation, the aluminum alloy preferably has between about 2.5 and 3.5 atoms of aluminum for every atom of alloyed ignitible metal, and the leaching preferably removes all the aluminum in excess of two atoms per atom of ignitible metal. This is illustrated by the following example:

EXAMPLE 5

One kilogram of aluminum covered by a cryolite flux is melted in a stainless steel retort under argon, and there is then stirred into the melt 600 grams of powdered molybdenum. The stirring is continued for about ½ hour while the contents of the retort are maintained at about 1200° C. to about 1400° C. to complete the alloying.

The melt is then permitted to cool and solidify, after which the metal layer is crushed into small pieces and the pieces ground to a maximum particle size of about 0.3 millimeter. The ground product is now poured into an excess of 25% NaOH solution in water. Bubbles are immediately evolved as the caustic attacks the alloy particles, and the evolution begins to noticeably slow down after several hours, reaching a very low level after about six hours. The caustic is then poured off, and the residual particles washed with water and dried.

Thus activated, the particles have a porous surface and are stable in air at temperatures as high as 300° C. However, when a mass of the particles is heated in air to above that temperature, the particles ignite and vigorously react with the air. The reaction is an oxidation and is completed on the smaller particles before it is completed on the larger particles of the ground mass, so that the pyrotechnic effect is more intense for about the first minute, and drops off somewhat for about another minute. On an asbestos pad the oxidizing particles become red hot and gradually crumble to a powder. Such pyrotechnics generate temperatures well over 1000° C., and can accordingly be used to supply heat for the bright annealing or other purposes.

Zirconium and columbium behave very similarly when treated as in the foregoing Example. After activation they ignite at about 350° C. in air at atmospheric pressure, and the ignition point of their aluminum alloy before activation is about 500° C., being not much different from the ignition point of the pure metals.

The activities of the activated alloys are lower when the leaching is terminated earlier, and are also lower when the alloys subjected to the activation have a less than 3:1 proportion of aluminum atoms to ignitible metal atoms. There are also some reactivity increases when the leaching is made more intense, as by starting with a hot or boiling caustic solution, and by increasing the caustic concentration to saturation. However, very good reactivity is obtained when the leaching is effected at 20° C., although the leaching is slower at that temperature. At boiling temperatures with saturated caustic, the leacing can be completed in less than two minutes.

It is not essential for the aluminides of the present invention to be prepared by melting. Thus, iron, zirconium, titanium, molybdenum and columbium can be effectively alloyed with aluminum by a thermal diffusion. Fine powders of the separate alloy ingredients can be uniformly mixed in a diffusion coating retort and heated to about 600° C. in an $AlCl_3$ atmosphere for only about six hours to produce usable alloy when the ignitible metal powder particles are no larger than about 10 microns. Larger particles take a little longer. Other halide atmospheres, such as of anhydrous $CrCl_3$, either in its water-soluble or water-insoluble form, or elemental chlorine, bromine or iodine, can be used in place of the $AlCl_3$ as the diffusion-energizing atmosphere. Only about ½% to about 1% of such energizer is mixed with the powders to be alloyed.

Tri-aluminides of some of the noted metals are also available as articles of commerce.

The leaching of the present invention can also be effected with inhibited hydrochloric acid such as that referred to supra, but the resulting activation is not as great as produced by caustic leaches, and is sometimes absent.

There can also be included in the foregoing alloys ingredients that improve the pyrotechnic behavior.

Thus, about 2% to 20% of boron or magnesium or iron or mixtures of these, are helpful in this respect, and can be added to a melt or to a diffusion-alloying mixture Also, these metals can be introduced by diffusion into a pre-formed aluminide or by diffusion with the aluminum. For example, 250 grams of powdered $ZrAl_4$ can be mixed with 10 grams of powdered boron and 5 grams of sodium fluoborate, and subjected to a diffusion heat as described in U.S. Pat. No. 3,801,357, but without using inert solid diluent, for three hours at 1800° F. in an argon-bathed atmosphere.

About 1% to about 10% of iron can be similarly introduced into the aluminide with or without the boron, to provide activatable alloys that after activation ignite at temperatures of about 300° C. or a little lower. Magnesium-aluminum alloys can also be activated by the foregoing techniques to provide activated material having ignition temperatures below 300° C. The magnesium-aluminum alloys preferably have, before activation, at least two atoms of aluminum for every atom of magnesium, but can be activated even when the aluminum-magnesium atom proportion is as low as 1½:1. The aluminum-to-zirconium atom ratio is preferably at least 4:1 but can be as low as 2:1.

Including 2% to 20% boron in the magnesium-aluminum or zirconium-aluminum alloys, based on the weight of the magnesium or zirconium, also increases their pyrotechnic output.

The foregoing pyrotechnic improvements are also obtained with alloys in the form of foils and sheets, as well as powders.

The boron additions of the present invention can also be effected by the procedures described in U.S. Pat. No. 4,536,215.

The foregoing low-ignition-point activated alloys are readily ignited with an ordinary household match.

Obviously many modifications and variations of the present invention are possible in light of the above teachings. It is, therefore, to be understood that within the scope of the appended claims the invention may be practiced otherwise than as specified.

I claim:

1. A self-supporting film of binder resin not over about ¾ millimeter thick, which film adherently carries sufficient pyrophoric particles to produce pyrophoric action when exposed to air.

2. The film of claim 1 in which a face of the particle-carrying film contains a coating of powder that improves the decoying effect of the radiation produced by the pyrophoric action.

3. A self-supporting sheet having at least one of its surfaces carrying discrete particles of pyrophoric iron or nickel powder embedded in place.

4. The combination of claim 3 in which the sheet contains pores and the pyrophoric powder particles are embedded in the pores.

5. The combination of claim 3 in which the sheet is paper.

6. The combination of claim 3 in which the sheet is a metal web and the discrete particles are aluminides that are formed in place on the web.

* * * * *